United States Patent [19]
Ohsawa et al.

[11] Patent Number: 6,051,450
[45] Date of Patent: Apr. 18, 2000

[54] LEAD FRAME, MANUFACTURING METHOD OF A LEAD FRAME, SEMICONDUCTOR DEVICE, ASSEMBLING METHOD OF A SEMICONDUCTOR DEVICE, AND ELECTRONIC APPARATUS

[75] Inventors: Kenji Ohsawa; Hidetoshi Kusano; Haruhiko Makino; Hideyuki Takahashi, all of Kanagawa, Japan

[73] Assignee: Sony Corporation, Tokyo, Japan

[21] Appl. No.: 09/106,772

[22] Filed: Jun. 30, 1998

[30] Foreign Application Priority Data

Jul. 1, 1997 [JP] Japan .................................. 9-175807
Dec. 24, 1997 [JP] Japan .................................. 9-354244

[51] Int. Cl.[7] .......................... H01L 21/50; H01L 21/44; H01L 23/48; H01L 23/52; H01L 23/34
[52] U.S. Cl. ........................ 438/123; 438/122; 438/611; 438/613; 257/692; 257/713; 257/735; 257/737
[58] Field of Search .................... 438/123, 111, 438/611, 613, 122; 257/690, 713, 735, 673, 692

[56] References Cited

U.S. PATENT DOCUMENTS

| | | | |
|---|---|---|---|
| 5,481,798 | 1/1996 | Ohsawa | 29/827 |
| 5,786,239 | 7/1998 | Ohsawa et al. | 438/123 |

FOREIGN PATENT DOCUMENTS

| | | |
|---|---|---|
| 62-008642 | 1/1987 | Japan . |
| 63-053959 | 3/1988 | Japan . |
| 63-239852 | 10/1988 | Japan . |

*Primary Examiner*—Wael Fahmy
*Assistant Examiner*—Neal Berezny
*Attorney, Agent, or Firm*—Hill & Simpson

[57] ABSTRACT

Metal films (for instance, gold films or palladium films) to constitute bumps are formed on a metal base by electrolytic plating. Then, a circuit wiring including inner leads is formed by electrolytic plating with a metal so that the inner leads are connected to the respective metal films.

9 Claims, 9 Drawing Sheets

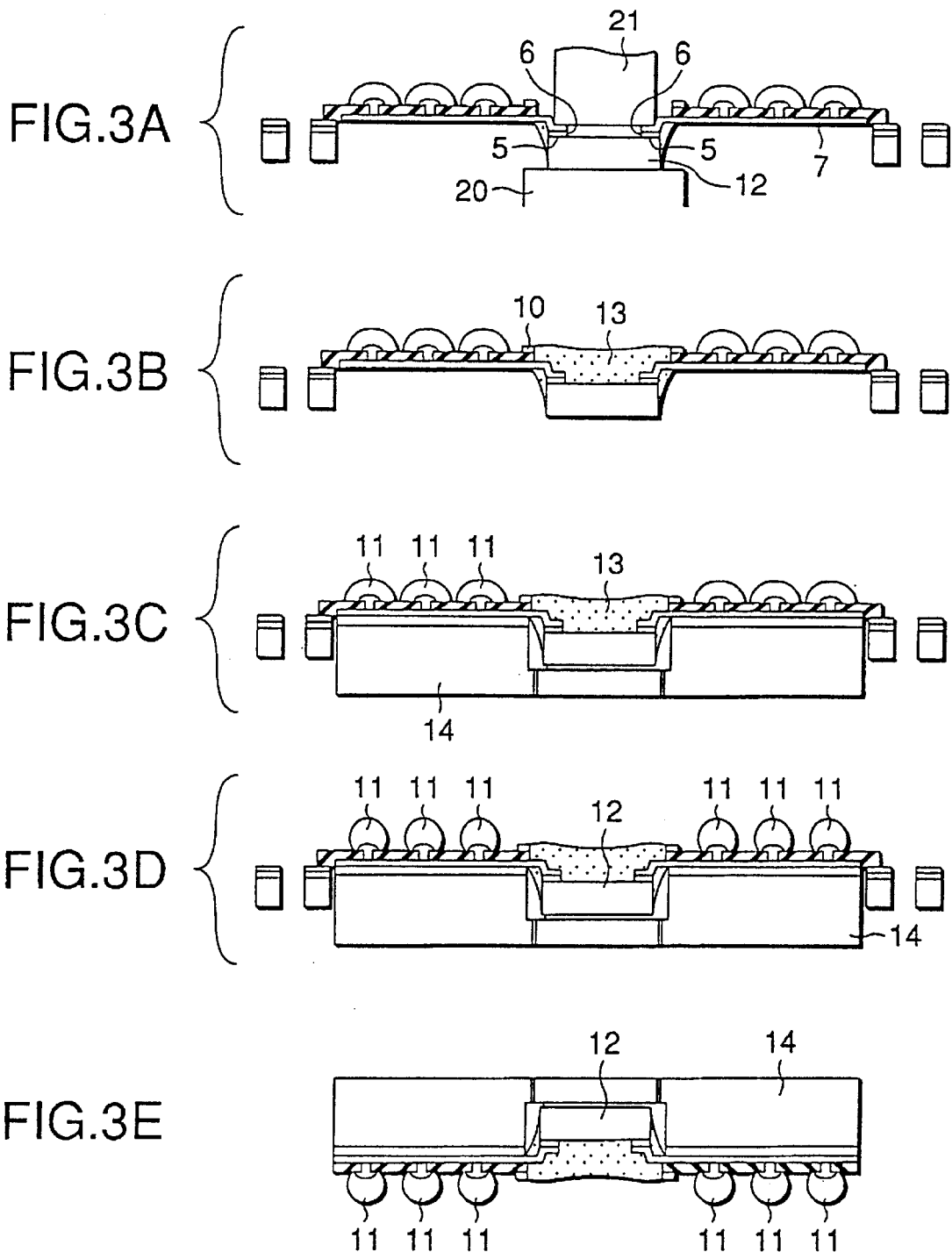

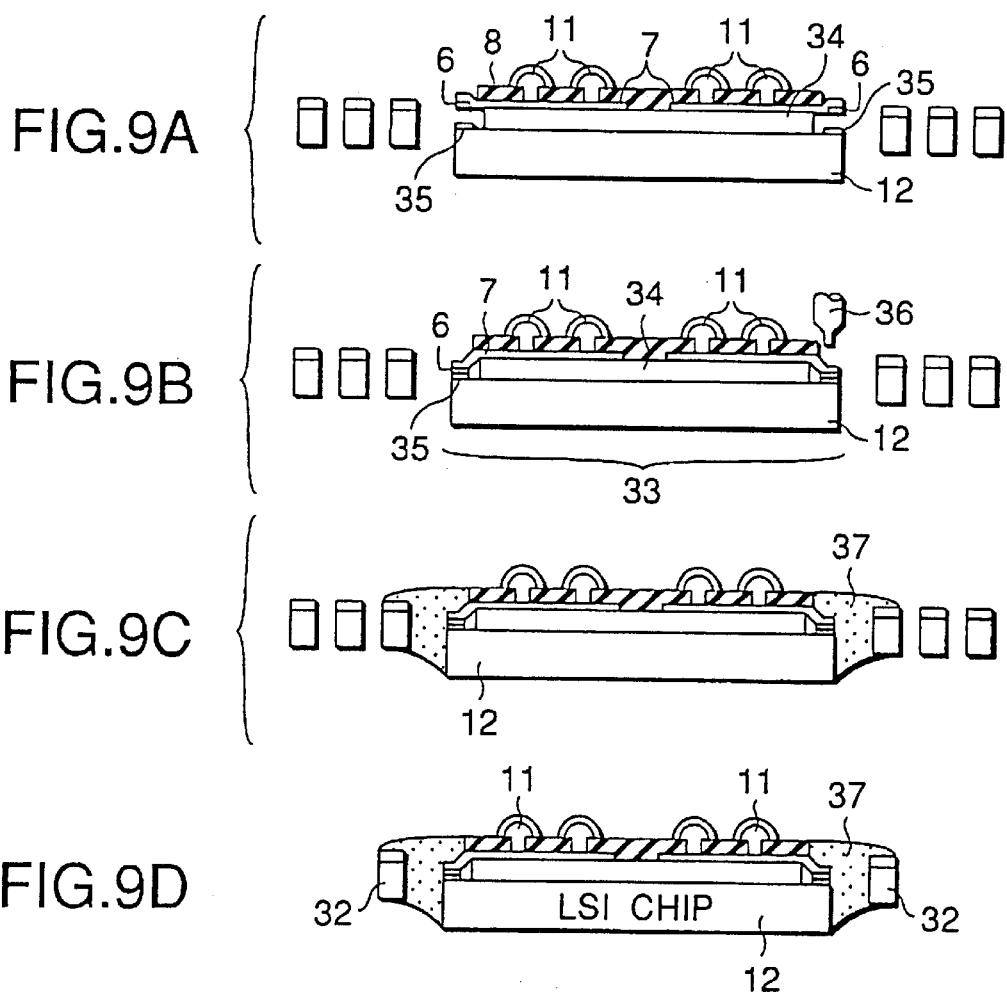
FIG. 9A
FIG. 9B
FIG. 9C
FIG. 9D
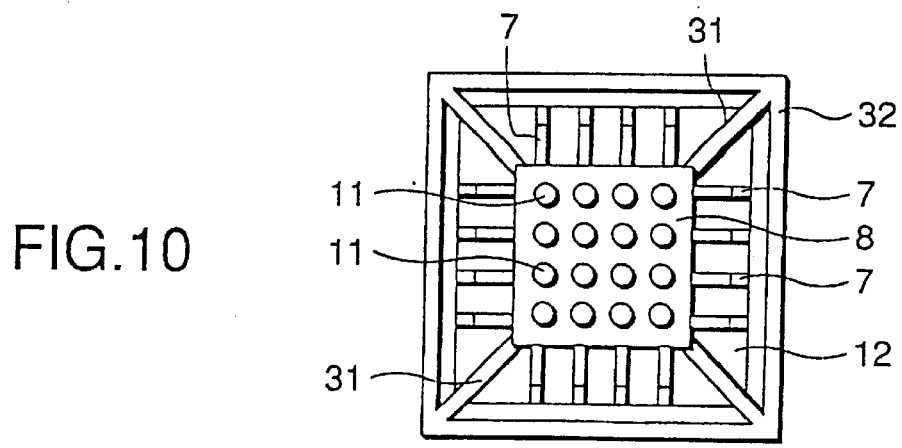
FIG. 10

LEAD FRAME, MANUFACTURING METHOD OF A LEAD FRAME, SEMICONDUCTOR DEVICE, ASSEMBLING METHOD OF A SEMICONDUCTOR DEVICE, AND ELECTRONIC APPARATUS

BACKGROUND OF THE INVENTION

The present invention relates to a lead frame, particularly a lead frame which uses, as a base material, a base having a metal such as a copper-type metal as the main component and which has bumps made of a metal on the surfaces of inner lead tip portions. The invention also relates to a manufacturing method of such a lead frame, a semiconductor device using such a lead frame, an assembling method of the semiconductor device, and an electronic apparatus using the semiconductor device.

Lead frames are indispensable for the techniques of forming leads of respective electrodes of a semiconductor chip, and commonly used in mounting semiconductor chips. Lead frames are generally made of a copper-type material, and bumps are formed on the surfaces of respective inner lead tip portions so as to be bonded to respective electrode pads on a semiconductor chip. Although previously such bumps were using aluminum, in recent years techniques of forming bumps using gold have been developed. The reasons for forming bumps made of gold are that good bonding performance is obtained and that gang bonding is enabled which provides high production efficiency than single point bonding.

In particular, the fact that gang bonding is enabled is very important for the following reason. Electrode pads of a semiconductor chip are made of aluminum. According to the current technology, single point bonding should be used to bond leads of the previous type having aluminum bumps to such aluminum pads. Where bumps are made of gold, gang bonding can be performed and hence the bonding efficiency can greatly be increased.

FIG. 1 illustrates bonding in a case where bumps are made of gold. Respective inner leads made of copper, for instance, have bumps (having a three-layer structure of gold, tin, and aluminum that are provided in this order from the surface) at the tip portions. The bumps are positioned above respective electrode pads (having a three-layer structure of gold, tin, and aluminum that are provided in this order from the surface) of a semiconductor chip and then bonded thereto by ultrasonic bonding by using a bonding tool.

The conventional techniques of forming bumps made of gold will be described below. In a first technique, the bump-forming side of each inner lead made of copper or the like is selectively half-etched so that a bump-forming portion is protruded. Then, the entire lead surface is plated with gold (a nickel plating layer is formed as an undercoat). In a second technique, gold to constitute a bump is transferred to each inner lead surface by a transfer method. In a third method, gold is evaporated on a bump-forming portion of each inner lead. In a fourth method, the entire surface of each inner lead is plated with a gold film with a nickel plating layer formed as an undercoat.

Each of the above conventional techniques of forming bumps made of gold which provide good bonding performance and enable gang bonding has the following problems. The first technique, in which the bump-forming side of each inner lead is selectively half-etched so that a bump-forming portion is protruded and then the entire lead surface is plated with gold, has a problem that because copper that constitutes leads is hard, electrode pads of an IC chip are prone to cracking. Since a nickel plating layer needs to be formed as an undercoat of a gold plating layer, the number of steps is increased. Further, where gold is formed on the entire lead surface, a large amount of gold is used, to increase the material cost, that is, the overall cost.

The second technique, in which gold to constitute a bump is transferred to each inner lead surface by a transfer method, has a problem that it is prone to positional deviations because of low accuracy of the transfer position control.

The third technique, in which gold is evaporated on a bump-forming portion of each inner lead, has problems that it requires a large investment in equipment because evaporation equipment is expensive, that the productivity is low because gold evaporation takes long time, and that the adhesion between a gold evaporation film and a copper lead is insufficient.

In the fourth technique, in which the entire surface of each inner lead is plated with a gold film with a nickel plating layer formed as an undercoat, has a problem that the number of steps is increased because the nickel plating layer needs to be formed as the undercoat of the gold plating layer. Further, where gold is formed on the entire lead surface, a large amount of gold is used, to increase the material cost. In particular, the gold plating film needs to be formed so as to be thick enough to secure good bonding performance. Forming so thick a gold plating film consumes a very large amount of gold, to cause a non-negligible cost increase.

SUMMARY OF THE INVENTION

The present invention has been made to solve the above problems in the art, and an object of the invention is therefore to improve the positional accuracy of bump forming positions, enable bumps to be formed even when the inner lead pitch is made finer, form in a relatively short time bumps that are thick enough to secure good bonding performance without using evaporation that is low in productivity and requires a high equipment cost, provides sufficient adhesion between bumps and inner leads, improve the bonding performance while preventing an undue increase in material cost by avoiding useless consumption of a metal, enables gang bonding, and reduce the cost of a metal material of bumps in manufacture of a lead frame which uses, for instance, a metal base as a base material and has bumps made of a metal on the surfaces of inner lead tip portions.

The invention provides a first manufacturing method of a lead frame, comprising the steps of forming metal films to constitute bumps by plating on a base made of a metal; and forming, by plating with a metal, a circuit wiring including inner leads so that the inner leads are connected to the respective metal films.

This manufacturing method of a lead frame can increase the adhesion to the underlying member because of the use of plating rather than evaporation, and can shorten the time required for forming metal films of a necessary thickness because of their high growth rate. Further, the investment in equipment can be reduced because the cost of equipment for plating is lower than that for evaporation.

Since metal films to constitute bumps are formed by plating on a highly rigid base that has not been formed with inner leads yet, the underlying member (base member) is more stable than in a case of forming metal films on the tip portions of the surfaces of inner leads already formed. Therefore, the bumps are easy to form and the accuracy of their forming positions can be increased.

The metal films may be formed by forming, on the base, a resist film having a negative pattern of a pattern of the intended circuit wiring, and performing the plating in a state that tip portions of the respective inner leads are masked by a mask jig so as to be prevented from being plated. In this case, by securing a proper positional relationship between the resist film and the mask jig, the metal films to constitute bumps can easily be formed with a correct positional relationship with inner leads to be formed next so as to be connected to the metal films.

Further, the circuit wiring including the inner leads may be formed thereafter by performing plating by using only the resist film as a mask in a state that the mask jig is removed. In this case, a desired positional relationship between the bumps and the circuit wiring can be established with high accuracy.

The invention also provides a second manufacturing method of a lead frame, comprising the steps of forming metal films to constitute bumps by plating on a base having, on a surface thereof, an etching stop layer; forming, by plating with a metal, a circuit wiring including inner leads so that the inner leads are connected to the respective metal films; forming, so as to cover the circuit wiring, an insulating film having openings where the circuit wiring is exposed; forming external electrodes in the respective openings by plating; selectively etching a portion, opposite to the circuit wiring, of the base by using the etching stop layer as a stopper for preventing etching of a portion, on a side of the circuit wiring, of the base; and removing the etching stop layer.

In this manufacturing method of a lead frame, metal films to constitute bumps are formed on a base having an etching stop layer on its surface and a circuit wiring is thereafter formed. This makes it possible to apply the technique of the above-described first manufacturing method of a lead frame for forming metal films as bumps to techniques in which inner leads are formed by using, as a base, a structure in which an etching stop layer is formed on the surface of a relatively thick metal layer made of copper or the like that will become the frame portion of a lead frame, that is, an outer ring, or by using a structure in which a material layer for forming a circuit wiring including inner leads is further formed on the surface of the etching stop layer (refer to Japanese Unexamined Patent Publication Nos. Hei. 8-148530 and Hei. 8-47221).

The invention provides a lead frame comprising an insulating film having openings; a wiring film including inner leads formed on one surface of the insulating film; electrodes as external terminals provided on the other surface of the insulating film so as to be connected to the wiring film through the openings of the insulating film; and bumps made of palladium and connected to the respective inner leads. The invention also provides a semiconductor device using this lead frame.

According to the above lead frame and semiconductor device, since the bumps are made of palladium rather than gold, the material cost is low and gang bonding is still possible. In the case of plating with gold, it is necessary to use a plating liquid containing cyan which is very toxic and dangerous. In the case of plating with aluminum, it is necessary to use an explosive plating liquid. (Aluminum is more frequently formed by evaporation than by plating.) In contrast, in the plating with palladium, it is not necessary to use such problematic plating liquids and hence a merit is obtained that the plating is very safe. An example of palladium plating liquids is paragrite SST of Kojundo Chemical Co. Since palladium plating liquids generally contain a toxic component having an ammonia-type pungent smell, they are not completely free of toxicity. However, gold plating liquids for industrial purposes generally contain cyan compounds, which are such toxic substances that even a very small amount thereof is lethal because cyan compounds produce a hydrogen cyanide gas when reacting with hydrochloric acid HCl or the like. Palladium plating liquids are thus much safer than gold plating liquids.

The invention provides an assembling method of a semiconductor device, comprising the steps of manufacturing a lead frame by any of the above manufacturing methods of a lead frame; and bonding, at the bumps, the inner leads of the lead frame to respective electrode pads of a semiconductor chip by single point bonding or gang bonding.

According to this assembling method of a semiconductor device, since a lead frame manufactured by any of the above manufacturing methods of a lead frame is used, a lead frame formed with bumps that has good bonding performance and enables gang bonding can be used in assembling a semiconductor device. Where the inner leads of such a lead frame are bonded to the respective electrode pads of a semiconductor device by single point bonding, bonding can be performed with much superior performance. Where gang bonding is performed, the productivity can be increased.

Further, the invention provides an electronic apparatus comprising a semiconductor device that uses the above-described lead frame.

By virtue of the use of a semiconductor device that is given the above-mentioned advantages of the lead frame, this electronic apparatus benefits from the same advantages.

BRIEF DESCRIPTION OF THE DRAWINGS

FIGS. 3A–3E are sectional views showing, in order of steps, a process of attaching a semiconductor chip to the lead frame hat has been subjected to the process of FIGS. 2A–2F (a first embodiment of an assembling method of a semiconductor device according to the invention);

FIGS. 9A–9D are sectional views showing, in order of steps, a process of attaching a lead frame that has been manufactured by the process of FIGS. 8A–8F to a semiconductor chip;

FIG. 10 is a plan view of a semiconductor device produced by the assembling method of FIGS. 9A–9D in which a sealing agent is omitted.

DETAILED DESCRIPTION OF THE PREFERRED EMBODIMENTS

Figure 1:
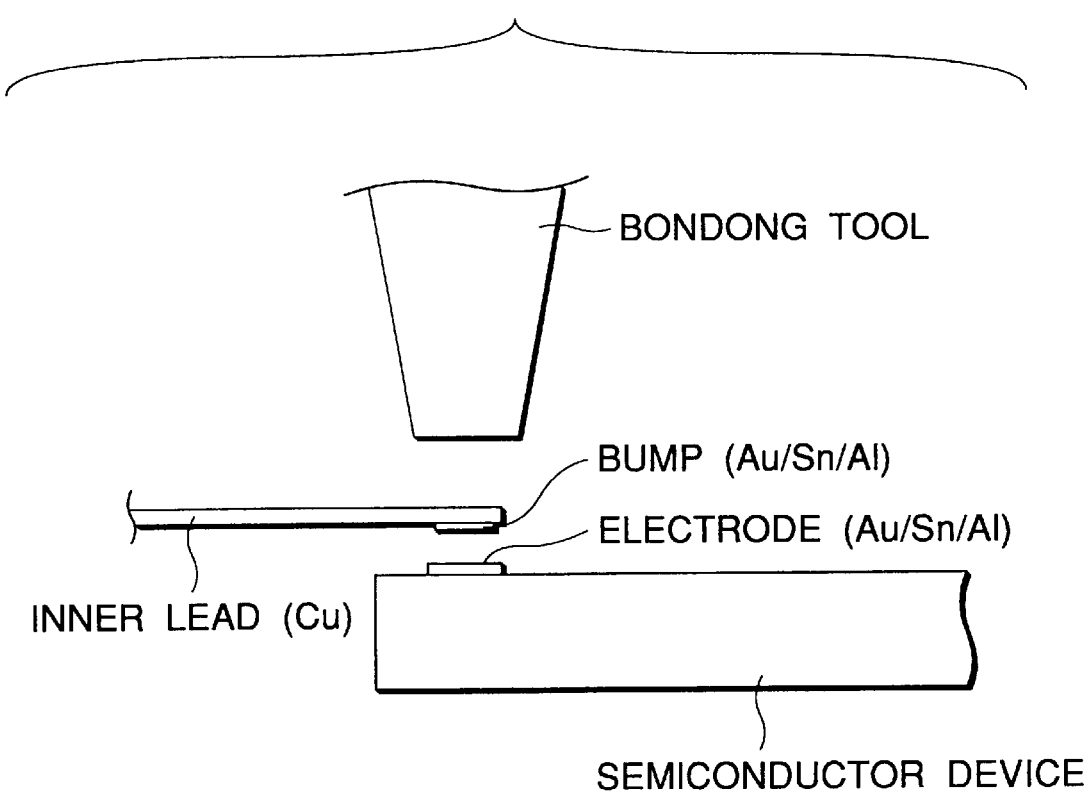
FIG. 1 illustrates bonding of bumps of a lead frame to electrode pads of a semiconductor chip.

Basically, the present invention is characterized by the steps of forming metal films to constitute bumps by plating at positions on a base made of a metal that allow the bumps to be bonded to at least respective electrodes of a semiconductor chip; and forming, by plating with a metal, a circuit wiring including inner leads so that the inner leads are connected to the respective metal films. Although the most general metal material to constitute bases is copper or copper-type metals, the invention is not necessarily limited to such a case. Although the most general material to constitute the circuit wiring including inner leads is also copper or copper-type metals, the invention is not necessarily limited to such a case.

The invention may be practiced in a form that the metal films are formed by forming, on the base, a resist film having a negative pattern of a pattern of the intended circuit wiring, and performing the plating in a state that tip portions of the respective inner leads are masked by a mask jig so as to be prevented from being plated, and the circuit wiring is formed by removing the mask jig and performing plating by using only the resist film as a mask. In this case, in forming the metal films to constitute bumps, not only the resist film but also the mask jig needs to serve as a mask. The plating for forming the metal films should be electrolytic plating. That is, it is impossible to use electroless plating. For example, the mask jig may be made of such a material as plastics.

The metal films to constitute bumps may be formed by using gold, for instance. Alternatively, they may be made of palladium. A first advantage of using palladium as the bump material is that the cost is lower than in the case of using gold. A resulting lead frame, a semiconductor device using such a lead frame, and an electronic apparatus using such a semiconductor device can be made less expensive. A second advantage is that the palladium plating causes no danger and makes the management easier, for the following reasons. The gold plating uses a plating liquid containing cyan which is toxic and dangerous. The aluminum plating needs to use an explosive liquid (though aluminum films are more frequently formed by evaporation than plating) and is hence dangerous. In contrast, the palladium plating need not use such dangerous plating liquids. For example, the palladium plating liquid may be paragrite SST of Kojundo Chemical Co. Other palladium plating liquids may also be used. It is preferable to form palladium films to constitute bumps at a thickness of 0.01 $\mu$m or more, because if they are thinner than 0.01 $\mu$m it is difficult to obtain bumps having bonding performance, elasticity, etc. of required levels. It is preferable to form nickel films as undercoats of the respective palladium films, because the nickel films can prevent diffusion of vibration in bonding the bumps to the respective electrodes of a semiconductor chip by ultrasonic vibration. Where nickel films are formed as diffusion preventive films, it is preferable that their thickness be 0.1 $\mu$m or more, for instance. This is because if the nickel films are thinner than 0.1 $\mu$m it is difficult to obtain a sufficient diffusion preventive effect.

The invention can also be practiced in a form comprising the steps of forming metal films (for instance, gold films or palladium films) to constitute bumps by plating at positions on a base made of a metal corresponding to at least respective electrodes of a semiconductor chip, the base having, on a surface thereof, a metal layer to serve as an etching stopper, that is, an etching stop layer; forming, by plating with a metal, a circuit wiring including inner leads so that the leads are connected to the respective metal films; forming, so as to cover the circuit wiring, an insulating film having openings where the circuit wiring is exposed; forming external electrodes in the respective openings by plating; selectively etching a portion, opposite to the circuit wiring, of the base by using the etching stop layer as a stopper for preventing etching of a portion, on a side of the circuit wiring, of the base; and removing the etching stop layer. Although it is preferable that the insulating film be, for instance, a resin such as polyimide, the invention is not necessarily limited to such a case.

It is necessary that the metal layer to serve as an etching stopper be made of a material having a much different etching rate than the metal layers constituting the base and the circuit wiring including the inner leads. The metal layer to serve as an etching stopper may be made of any material as long as it can function as an etching stopper in etching the metal layers constituting the base etc. and the metal layers constituting the base etc. can be used as a mask when the metal layer itself is etched. For example, where the base and the circuit wiring including the inner leads are made of copper or a copper-type metal, aluminum or a nickel-type metal (nickel or a nickel/phosphorus alloy) can be used as the etching stop layer. Where an aluminum-type metal is used, a $H_2O_2/H_2SO_3$-type etching liquid, for instance, is suitably used as an etching liquid for forming inner leads etc. by etching the metal layers made of copper or the like by using the aluminum-type metal layer as an etching stopper. An alkali solution type etching liquid is suitably used as an etching liquid for etching the aluminum film by using patterned layers of copper or the like.

A mixed liquid of aqueous ammonia and cupric chloride is suitably used for etching a copper-type metal layer by using a nickel-type metal as an etching stop layer. An acid liquid whose main components are sulfuric acid, hydrogen peroxide, and aromatic sulfonic acid is suitably used for etching a nickel-type metal by using a copper-type metal layer as a mask.

A lead frame manufactured by any of the above manufacturing methods has bumps having good bonding performance. Therefore, where single point bonding is performed, superior bonding is obtained between the inner leads and the respective electrode pads of a semiconductor chip. Gang bonding can also be performed, in which case high production efficiency is attained because the bonding can be performed en bloc.

The invention will now be described in detail by using illustrated embodiments. FIGS. 2A–2F are sectional views showing, in order of steps, a first embodiment of a manufacturing method of a lead frame according to the invention. In this embodiment, the invention is applied to manufacture of a ball-grid-array-type lead frame.

Figure 2A:
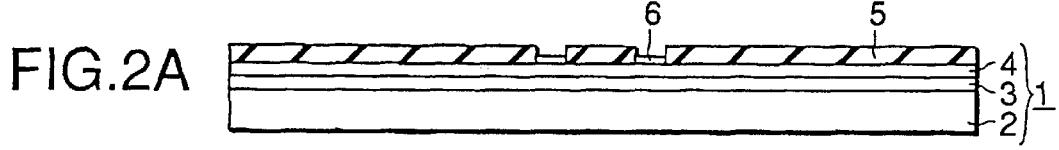
FIGS. 2A–2F are sectional views showing, in order of steps, a first embodiment of a manufacturing method of a lead frame according to the present invention.

First, as shown in FIG. 2A, a base 1 is prepared and gold films 6 to constitute bumps are formed in a state that the surface of the base 1 is masked selectively. Bumps may be formed by using palladium films instead of gold films. This case will be described later.

The base 1 will be described below in more detail. The base 1 has a multilayered structure in which an etching stop layer 3 (thickness: 2–5 $\mu$m, for instance) made of, for instance, nickel (or nickel containing phosphorus) is formed on the surface of a copper-type metal layer 2 (thickness: about 150 $\mu$m, for instance), and a copper layer 4 (thickness: about 0.5 $\mu$m, for instance) to serve as a plating undercoat layer is formed on the surface of the etching stop layer 3. The plating undercoat layer 4 merely facilitates plating that will be performed later to form inner leads etc. made of copper, and is not always necessary.

Thereafter, a resist film 5 (made of a dry film resist and having a thickness of about 40 μm, for instance) is formed on the surface of the copper layer 4 of the base 1, and then patterned by exposure and development so as to cover portions other than portions where bumps are to be formed. Gold films 6 to constitute bumps are formed on the copper layer 4 by electrolytic plating by using the resist film 5 as a mask. After the gold films 6 have been formed, the resist film 5 is removed.

Figure 2B:
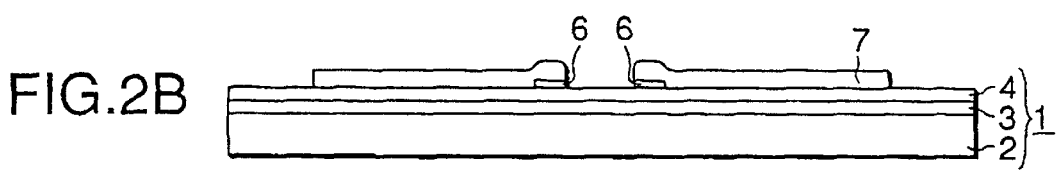

Then, as shown in FIG. 2B, a circuit wiring 7 (thickness: about 30 μm, for instance) including inner leads is formed by electrolytic plating with copper. For example, the electrolytic plating is performed by forming a patterned resist film as a mask. Therefore, the resist film should be a negative pattern of a pattern of the intended circuit wiring 7. The tips of the respective inner leads are located on the gold films 6 to constitute bumps.

Figure 2C:
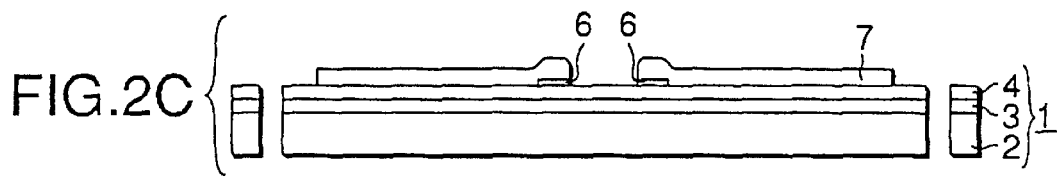

Then, selective through-etching is performed on the base 1 from both sides to thereby form a lead frame shape having film circuits of a plurality of ICs in an integral manner. For example, this etching may be performed by using a ferric chloride solution as an etching liquid. FIG. 2C shows a state after the etching.

Figure 2D:
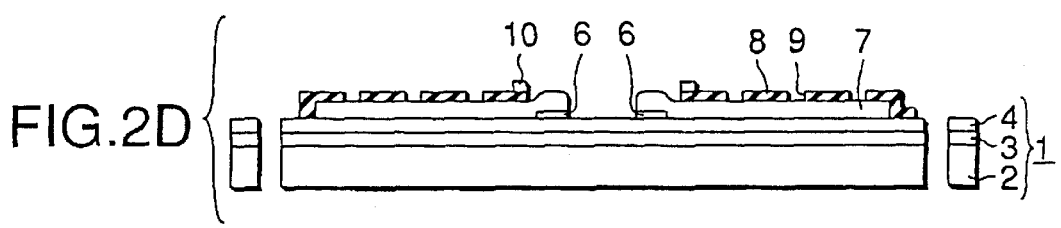

Then, an insulating film 8 made of, for instance, polyimide or an epoxy resin is selectively formed on the surfaces of the circuit wiring 7 including the inner leads. The insulating film 8 have openings 9 where surfaces of the circuit wiring 7 are exposed at portions where solder balls (electrodes) to become external electrodes are to be formed. Thereafter, a rectangular dam layer 10 made of polyimide tape, for instance, is formed. The dam layer 10 will be serve as dams for preventing a resin for sealing a bonded semiconductor chip from expanding so as to exceed an intended sealing portion, and is not always necessary. FIG. 2D shows a state after formation of the dam layer 10.

Figure 2E:
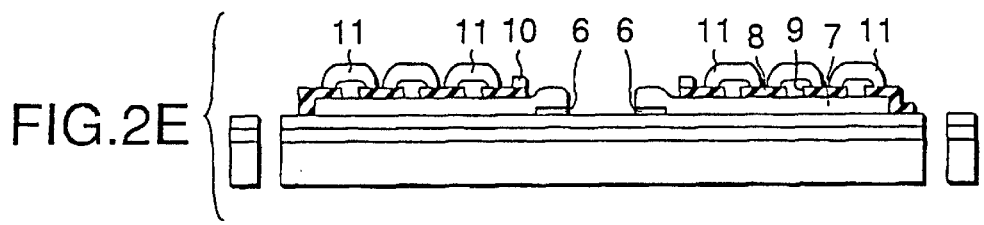
Figure 2F:
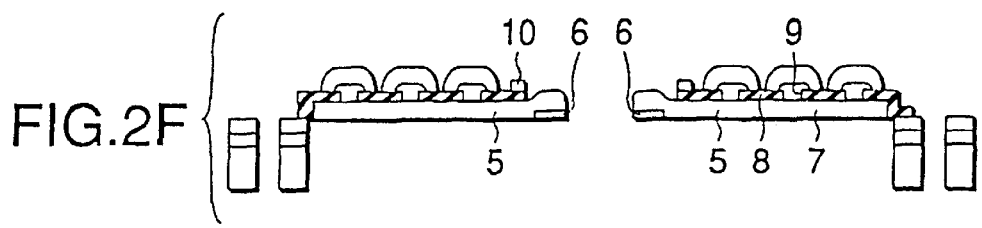

Then, as shown in FIG. 2E, solder balls 11 are formed on the surfaces of the circuit wiring 7 that are exposed through the openings 9 of the insulating film 8. Specifically, plating with nickel (thickness: 80–110 μm, for instance) and soldering are performed, or plating with gold (thickness: 0.1–5 μm, for instance) or palladium is performed.

Then, the copper layer 2 of the base 1, except for a portion to become a frame of the lead frame, is removed by selective etching that is performed from below. At this time, the etching stop layer 3 made of nickel serves as an etching stopper. For example, this etching is performed by using a mixed liquid of aqueous ammonia and cupric chloride as an etching liquid. Thereafter, the portion of the etching stop layer 3 made of nickel that is exposed on the back side and the copper layer 4 that served as the plating undercoat layer are removed (see FIG. 2F). For example, this etching is performed by using, as an etching liquid, a mixed liquid having sulfuric acid as the main material and containing a fluoride salt and a surfactant.

FIGS. 3A–3E are sectional views showing, in order of steps, a process of attaching a semiconductor chip to the lead frame that has been subjected to the process of FIGS. 2A–2F (a first embodiment of an assembling method of a semiconductor device according to the invention).

First, as shown in FIG. 3A, electrode pads (made of aluminum) of a semiconductor chip 12 are bonded to the respective inner leads 7 of the lead frame via the gold films 6 as the bumps. This bonding may be not only single point bonding but also gang bonding that can be performed en bloc and is high in efficiency. Specifically, the gang bonding is performed in the following manner. First, the semiconductor chip 12 is placed on a bonding stage 20 and the lead frame is positioned so that the bumps 6 of the respective inner leads 7 are located on the corresponding aluminum electrode pads of the semiconductor chip 12. In this state, bonding is performed en bloc by pressing the tip portions of all the inner leads 7 from above with a hot tool 21 that is heated to about 420° C., for instance.

Then, as shown in FIG. 3B, the surface of the semiconductor chip 12 to which the inner leads 7 are connected is sealed with a resin 13. At this time, the dam layer 10 prevent the resin 13 from further expanding outward.

Then, as shown in FIG. 3C, a heat spreader 14 is bonded to the back surface of the semiconductor chip 12 and the back surface of the lead frame.

Then, as shown in FIG. 3D, the solder bumps 11 are formed into dome shapes by reflow fusing.

Then, as shown in FIG. 3E, unnecessary portions of the lead frame are removed. As a result, the lead frames mounted with the respective semiconductor chips are separated from each other, that is, rendered independent of each other. In FIG. 3E, the lead frame is shown upside down. The lead frame in this posture is connected to, for instance, a wiring of a printed circuit board via the solder bumps 11.

The manufacturing method of a lead frame shown in FIGS. 2A–2F provides the following advantages because the gold films 6 to constitute bumps are formed by plating. First, because of the plating, the adhesion to the undercoats can be made stronger than in the case of evaporation. Since gold films grow at a high rate, the adhesion between the bumps 6 and the inner leads 7 can be made stronger than in the case of evaporation, whereby the bumps 6 are less prone to peel off. The time required for forming gold films of a necessary thickness, for instance, a thickness necessary for gang bonding (in general, 5–15 μm; for comparison, single bonding requires a thickness of about 0.1–5 μm), can be shortened. Further, since plating requires a lower equipment cost than evaporation, the investment in equipment can be reduced.

Since the gold films 6 to constitute bumps are formed by plating on the base 1 before formation of the inner leads 7 (the base 1 is highly rigid in this state), the base 1 is used as a path of supplying current to the bumps which path is necessary for electrolytic plating. With no need for forming a special wiring for the electrolytic plating, the plating is easy to perform. Further, since the bumps 6 are formed on the base 1, the underlying members (base members) are more stable than in the case where bumps are formed on the tip portions of the surfaces of inner leads already formed. Therefore, the manufacturing method of a lead frame according to this embodiment is free of a conventional problem that the inner leads that serve as the underlying members in forming bumps deviate due to their instability, resulting in deviations in bump forming positions.

Further, since the bumps 6 are formed by forming a resist film 5 on the surface of the base 1, patterning the resist film 5 by exposure and development, and forming gold films by electrolytic plating by using the resist pattern as a mask, the positioning can be made with very high working accuracy of the photolithography technology that is also used to form respective regions, interconnections, through-holes, etc. of a semiconductor chip. Therefore, the positioning accuracy and patterning accuracy of the bumps 6 can be made extremely high.

It is true that what is important is the relative positions of the bumps 6 with respect to the inner leads 7. If the positional accuracy of the inner leads 7 that are formed after formation of the bumps 6 were low, the positioning accuracy of the relative positions of the bumps 6 with respect to the inner leads 7 would be low. However, since the inner leads 7 are formed by the same photolithography technology as used in forming the bumps 6, positioning errors of the relative positions are on the order of mask alignment errors and hence are very small, that is, almost negligible. That is, the positioning accuracy of the relative positions of the bumps 6 with respect to the inner leads 7 can be made extremely high.

Therefore, in the manufacturing method of a lead frame according to this embodiment, the working accuracy of the inner leads 7 as well as the positional accuracy of the bumps 6 with respect to the inner leads 7 is extremely high. This enables, without causing any problems, gang bonding for bonding all the bumps 6 to all the electrode pads of a semiconductor chip en bloc. In addition, since the bumps 6 are formed by plating having a high growth rate, the time required for providing a thickness necessary for gang bonding can be made shorter than in the case of evaporation. This increases the application range of gang bonding and greatly contributes to increasing the productivity.

Figure 4A:
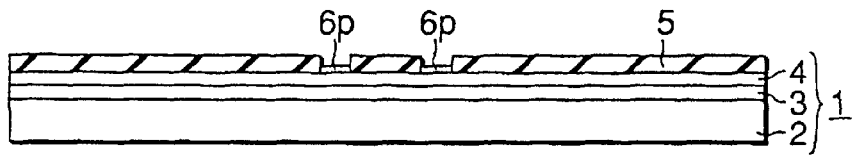
FIGS. 4A–4C are sectional views showing, in order of steps the main part of a second embodiment of a manufacturing method of a lead frame according to the invention.
Figure 4B:
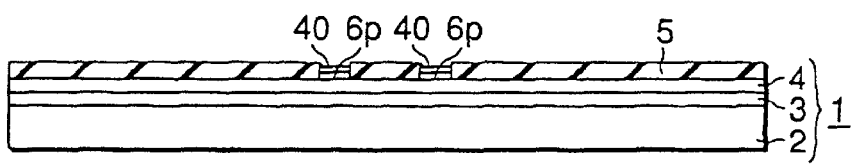
Figure 4C:
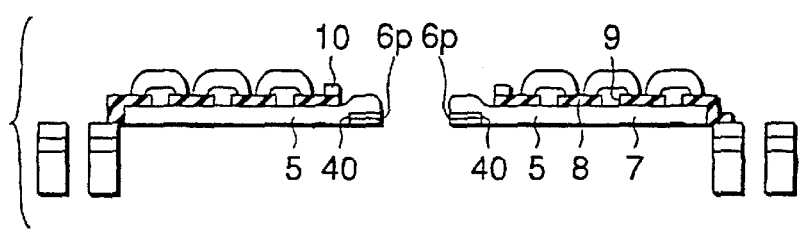

FIGS. 4A–4C are sectional views showing the main part of a second embodiment of a manufacturing method of a lead frame according to the invention. In this embodiment, bumps are formed by using palladium. That is, the plating that is performed to form bumps by using the resist film 5 as a mask is palladium plating as shown in FIG. 4A rather than the gold plating as described above in connection with FIG. 2A. For example, paragrite SST of Kojundo Chemical Co. is used as a palladium plating liquid. Reference symbol 6p denotes palladium films (thickness: 0.01 μm or more, for instance). The reasons for forming the palladium films 6p as bumps are as follows. First, although the material cost of palladium is lower than that of gold, palladium bumps provide better bonding performance than aluminum bumps and enable gang bonding. Second, palladium plating allows use of a safer plating liquid than gold plating and aluminum plating.

Then, as shown in FIG. 4B, nickel films 40 (thickness: 0.1 μm or more, for instance) are formed by using the resist film 5 as a mask. The nickel films 40 are so formed as to serve as undercoats of the bumps 6p for preventing ultrasonic vibration from escaping when the electrodes of a semiconductor chip and the bumps 6p of a circuit wiring are bonded to each other by ultrasonic bonding.

Figure 5:
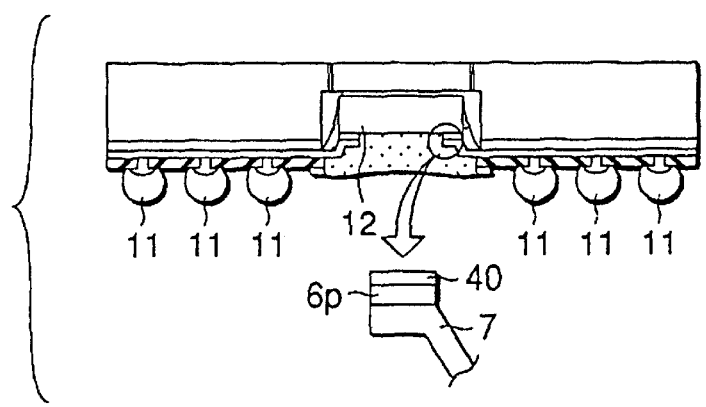
FIG. 5 shows a semiconductor device that uses a lead frame manufactured by the manufacturing method of FIGS. 4A–4C.

Thereafter, the lead frame manufacture is continued according to the same steps as described above in connection with FIGS. 2B–2F, whereby a lead frame shown in FIG. 4C is completed. A semiconductor device shown in FIG. 5 is produced by assembling it by the same method as described above in connection with FIGS. 3A–3E.

According to the above lead frame and semiconductor device, the material cost can be reduced because of the use of palladium that is less expensive than gold, which means that the prices of the lead frame and the semiconductor device can be reduced. This embodiment provides another advantage that the palladium plating can be managed easily because it is not necessary to use, as components of a plating liquid, a highly toxic substance such as cyan or an explosive substance.

FIGS. 6A–6D are sectional views showing, in order of steps, the main part of a third embodiment of a manufacturing method of a lead frame according to the invention. This embodiment is directed to a modification to the formation of the bumps (gold films 6 or palladium films 6p) in the embodiments shown in FIGS. 2A–2F and FIGS. 4A–4C. Since this embodiment is the same as the first embodiment except for the manner of forming bumps, a detailed description of the common part will be omitted. Although this embodiment is directed to a case where bumps are formed by using gold films 6, it goes without saying that they may be formed by using palladium films 6p.

Figure 6A:
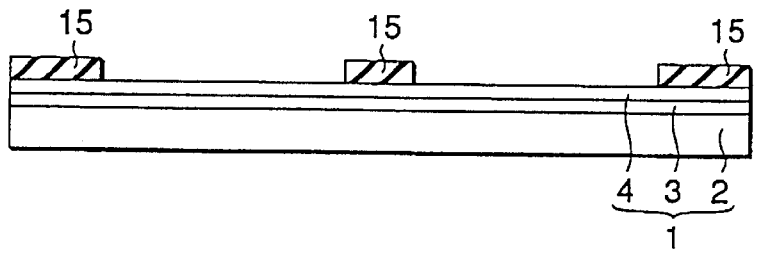
FIGS. 6A–6D are sectional views showing, in order of steps, the main part of a third embodiment of a manufacturing method of a lead frame according to the invention.

First, a base 1 is prepared that is the same as the base 1 shown in FIG. 2A. A resist film 15 having a negative pattern of a pattern of a circuit wiring including inner leads to be formed on the inner-leads-forming surface of the base 1, that is, the surface of the copper layer 4 as the plating undercoat layer. FIG. 6A shows a state after the formation of the resist film 15.

Figure 6B:
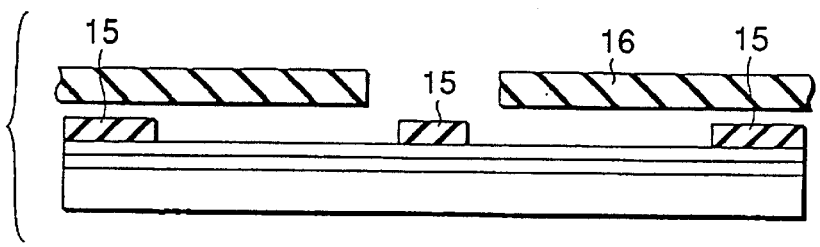

Then, as shown in FIG. 6B, the portions of inner leads 7 (to be formed in a later step) outside their tip portions where bumps are to be formed are masked by a mask jig 16 (made of plastics, for instance) that is applied from above.

Figure 6C:
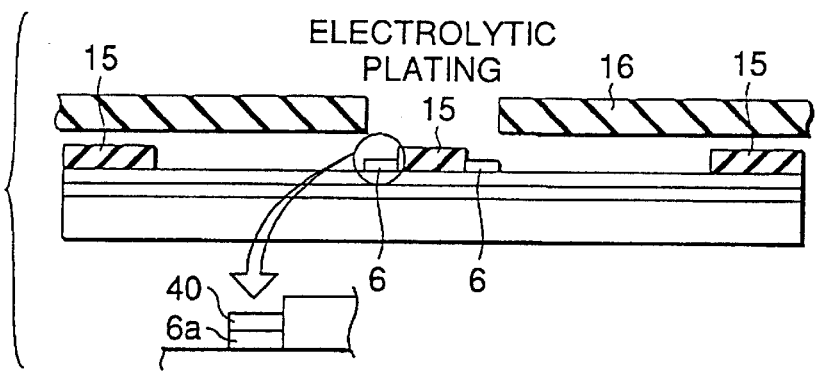

Then, as shown in FIG. 6C, gold films 6 to constitute bumps are formed by electrolytic plating. Nickel films as diffusion protective films may additionally be formed on the gold films 6. In the above electrolytic plating, the mask jig 16 and the resist film 15 that covers the copper film 4 as the plating undercoat film serve as masks. The mask jig 16 is then removed.

Where bumps are formed by using palladium films 6p, electrolytic plating is performed by using the mask jig 16 as a mask in the same manner as in the case of forming the gold films 6. Nickel films (corresponding to the nickel films 40 shown in FIG. 4B) are formed immediately thereafter. The bottom part of FIG. 6C extended by an arrow shows, in an enlarged manner, a bump portion in which the bump is formed by using a palladium film. Reference symbols 6p and 40 denote a palladium film and a nickel film, respectively.

Figure 6D:
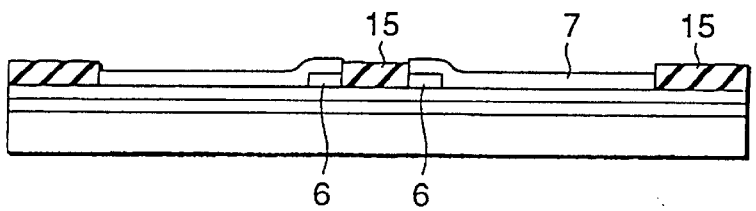

Then, as shown in FIG. 6D, a circuit wiring 7 including inner leads is formed by electrolytic plating with copper by using the resist film 15 as a mask.

Then, the process proceeds to the step of FIG. 2C and thereafter the same steps as in the first embodiment are executed. Attachment of a semiconductor chip (assembling of a semiconductor device) after manufacture of a lead frame is performed by the process of FIGS. 3A–3E.

The invention can be practiced in the above manner, in which case the productivity can be increased from the cases of the first and second embodiment because of a reduced number of steps, specifically, photolithography steps. In this embodiment, the positioning accuracy of the mask jig 16 is lower than the working accuracy of photolithography. However, the positioning accuracy of the bumps 6 (6p) satisfies required accuracy with a sufficient margin. Even if the mask jig 16 is placed with a certain positional deviation, there never occurs an event that the bumps 6 (6p) are formed so as to go out of the inner leads 7 in a horizontal direction because they are formed only in the regions that are not covered with the resist film 15 for formation of inner leads. A positional deviation of the mask jig 16 merely causes the bumps 6 to deviate in the longitudinal direction of the inner leads 7. This causes no problem because this type of deviation can be coped with by, for example, somewhat elongating the bumps 6 in advance in consideration of an expected deviation.

FIGS. 7A–7E are sectional views showing, in order of steps, the main part of a fourth embodiment of a manufacturing method of a lead frame according to the invention. This embodiment is much different from the first and second embodiments in that a single-layer metal plate made of copper or a copper alloy is used as a base and etching stop layers to later serve as etching stoppers are selectively formed on the surface of the metal plate. However, since this embodiment is the same as the first and second embodiments in the other points, a detailed description for those points will be omitted. Although in this embodiment gold films 6 are formed as bumps, it goes without saying that palladium films 6p may be formed instead.

Figure 7A:
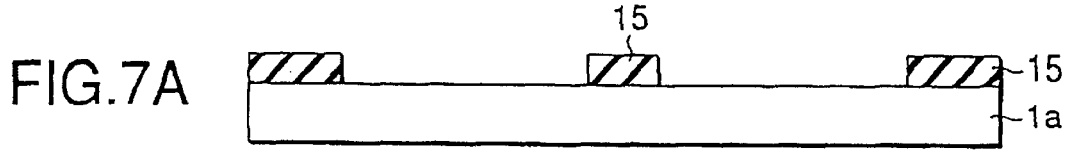
FIGS. 7A–7E are sectional views showing, in order of steps, the main part of a fourth embodiment of a manufacturing method of a lead frame according to the invention.

First, a single-layer metal plate 1a made of copper or a copper alloy is prepared as a base, and a resist film 15 having a negative pattern of a pattern of a circuit wiring including inner leads to be formed is formed on the inner-leads-forming surface of the metal plate 1a. FIG. 7A shows a state after the formation of the resist film 15.

Figure 7B:
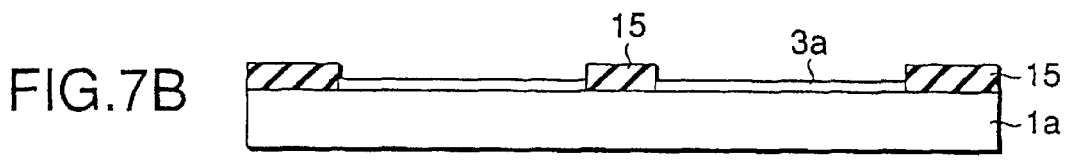

Then, as shown in FIG. 7B, etching stop layers 3a made of, for instance, nickel or a nickel-phosphorus alloy are formed by electrolytic plating by using the resist film 15 as a mask. The etching stop layers 3a will serve as etching stoppers and thereby protect a circuit wiring including inner leads when unnecessary portions of the base 1a are removed by selectively etching it from the back side (see the step shown in FIG. 2F). Since the etching stop layers 3a are required to merely protect the circuit wiring, they need not be formed over the entire surface and may have the same pattern as the circuit wiring. With the etching stop layers 3a having such a pattern, there is no possibility that the etching stop layers 3a short-circuit respective wiring lines. Therefore, it is not necessary to execute a step of removing the etching stop layers 3a. Copper layers, for instance, may be formed as plating undercoat layers after the formation of the etching stop layers 3a.

Figure 7C:
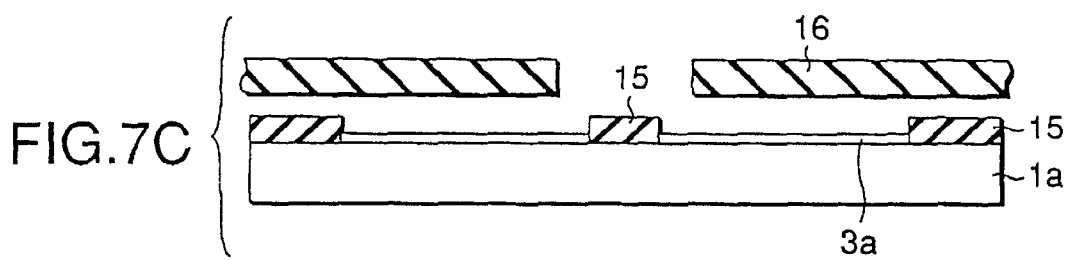

Then, as shown in FIG. 7C, the portions of inner leads outside their tip portions where bumps are to be formed are masked by a mask jig 16 that is applied from above. A photosensitive resin may be used as a mask.

Figure 7D:
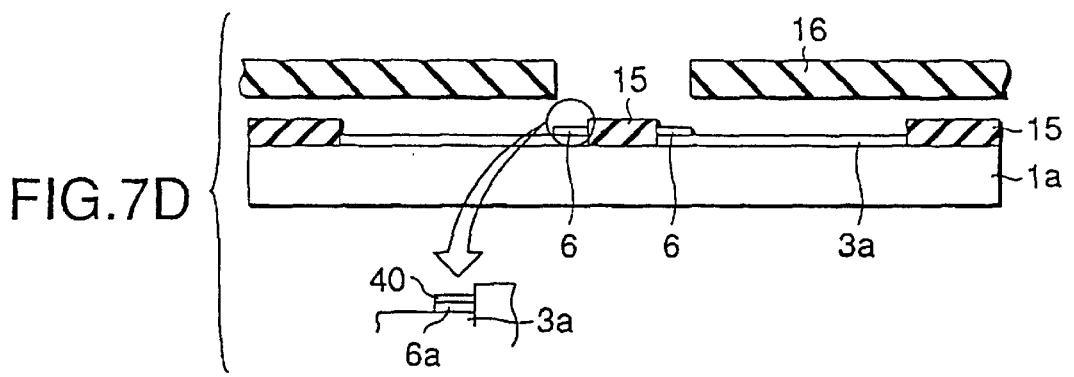

Then, as shown in FIG. 7D, gold films (or multilayered films in which a gold film is formed on a nickel film) 6 to constitute bumps are formed by electrolytic plating. In this electrolytic plating, the resist film 15 and the mask jig 16 serve as masks. The mask jig 16 is then removed.

As described above, where bumps are formed by using palladium films, palladium films (thickness: 0.01 μm or more, for instance) are formed instead of gold films by electrolytic plating by using the mask (the mask jig 16, a photosensitive resin, or the like) and, immediately thereafter, diffusion preventive nickel films (thickness: 0.1 μm or more, for instance) are formed by electrolytic plating. The bottom part of FIG. 7D extended by an arrow shows, in an enlarged manner, a bump portion in which the bump is formed by using a palladium film. Reference symbols 6p and 40 denote a palladium film and a nickel film, respectively.

Figure 7E:
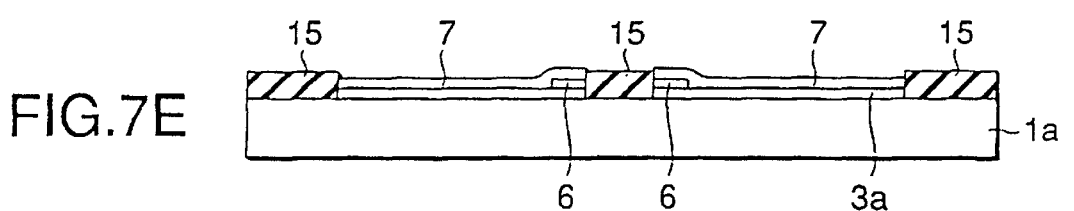

Then, as shown in FIG. 7E, a circuit wiring 7 including inner leads is formed by electrolytic plating with copper by using the resist film 15 as a mask.

Then, the process proceeds to the step of FIG. 2C and thereafter the same steps as in the first embodiment are executed.

However, the step of removing the etching stop layers 3a is not necessary. This point was briefly described above and will be described below in detail. Where the etching stop layer 3 is formed over the entire surface as in the case of the first and second embodiments, the etching stop layer 3 made of nickel serves as an etching stopper when the copper layer 2 of the base 1 excluding the portion to be used as a frame of a lead frame is removed by selective etching from below.

After the etching, the portions of the etching stop layer 3 made of nickel that are exposed on the back side and the copper layer 4 that was used as the plating undercoat layer are removed. This is because the respective inner leads would be short-circuited by the etching stopper layer 3 and the copper layer 4 if they were not removed.

In contrast, in the third embodiment shown in FIGS. 7A–7E, since the etching stop layers 3a have the same pattern as the circuit wiring including the inner leads, the respective inner leads are not short-circuited with each other. Therefore, it is not necessary to remove the etching stopper layers 3a.

Attachment of a semiconductor chip after manufacture of a lead frame is performed by the process of FIGS. 3A–3E. Naturally, the bumps 6 and the respective electrode pads of the semiconductor chip can be connected to each other by gang bonding.

FIGS. 8A–8F are sectional views showing, in order of steps, a fifth embodiment of a manufacturing method of a lead frame according to the invention. This embodiment is directed to a case where the invention is applied to manufacture of a chip-size-package-type lead frame. Although in this embodiment bumps are formed by using gold, they may be formed by using palladium.

Figure 8A:
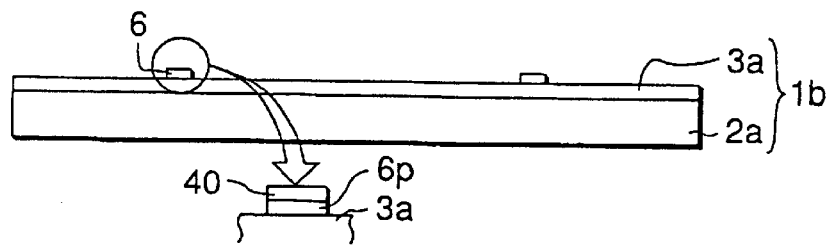
FIGS. 8A–8F are sectional views showing, in order of steps, a fifth embodiment of a manufacturing method of a lead frame according Mo the invention.

First, as shown in FIG. 8A, a two-layer laminated plate is prepared as a base 1b and gold films 6 to constitute bumps are formed on the base 1b.

The base 1b is one formed by laminating a copper layer 2a (thickness 150 μm, for instance) to become a ring (surrounding a semiconductor chip and bonded thereto to reinforce it; called an outer ring) and a nickel layer 3a (thickness: 2 μm, for instance) to serve as an etching stopper. A plating undercoat layer (thickness: 2 μm, for instance) made of copper may be laid on the nickel layer 3a. In this case, the plating undercoat layer may have a multilayered structure in which, for example, a nickel layer (thickness: 2 μm, for instance) is formed on a chromium layer (thickness: 0.2 μm, for instance).

The gold films 6 to constitute bumps are formed by forming a resist film selectively (so as to have a negative pattern of a pattern of the gold films 6 to be formed) on the base 1b and then performing electrolytic plating with gold by using the resist film as a mask. The thickness of the gold films 6 is set at 0.1–5 μm, for instance. This embodiment is directed to the case where the invention is applied to a chip-size-package-type lead frame. Single point bonding is performed in this type of lead frame, because it is difficult to perform gang bonding. In this case, the gold films 6 to constitute bumps are not required to be so thick as in the case where gang bonding is performed; the gold films 6 may be as thin as about 0.1–5 μm. After the formation of the gold films 6 (or multilayered films in which a nickel film is formed on a gold film), the resist film that was used in forming the gold films 6 are removed. FIG. 8A shows a state after the removal of the resist film.

Where bumps are formed by using palladium films rather than gold films, naturally the above step is replaced by a step of forming palladium films (plating film thickness: 0.01 μm or more) by electrolytic plating. After the formation of the palladium films, diffusion preventive nickel films (thickness: 0.1 μm or more) are formed by plating by using the mask itself that was used in forming the palladium films. The bottom part of FIG. 8A extended by an arrow shows, in an enlarged manner, a bump portion in which the bump is formed by using a palladium film. Reference symbols 6p and 40 denote a palladium film and a nickel film, respectively.

Figure 8B:
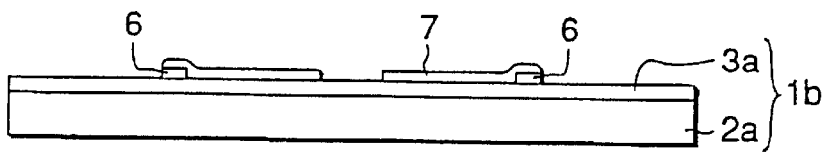

Then, as shown in FIG. 8B, inner leads 7 and suspensions 31 (absent in FIG. 8B, present in FIG. 10) on the base 1b. Specifically, a resist is formed so as to have a negative pattern of an intended pattern of the inner leads 7 and the suspensions 31 and then copper plating is performed (plating thickness: 30 μm, for instance) by using the resist as a mask.

The suspensions 31, which will suspend a reinforcement outer ring (32) surrounding a semiconductor chip (12), exist in the same layer as the inner leads 7 and hence are made of copper, for instance. On the other hand, the ring (32) (not formed yet at the present stage), which will be formed outside a lead frame main portion so as to be integral with it via the suspensions 31, will have a multilayered structure of copper/nickel (or aluminum)/copper, for instance.

Figure 8C:
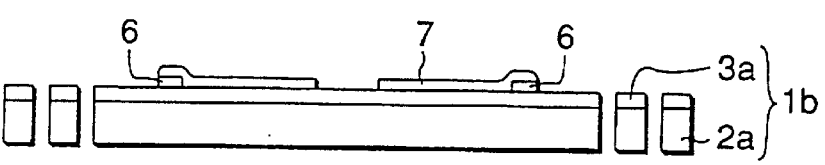

Then, as shown in FIG. 8C, selective through-etching is performed on the base 1b from both sides to thereby form a lead frame shape having a plurality of film circuits in an integral manner. For example, this etching may be performed by using a ferric chloride type etching liquid.

Figure 8D:
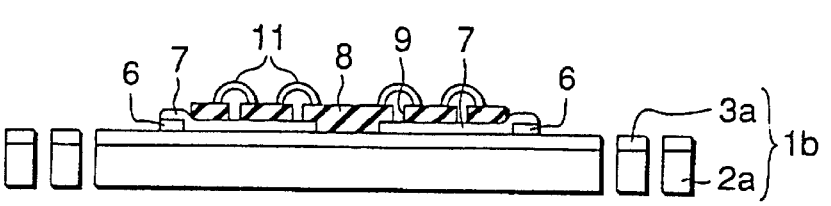

Then, as shown in FIG. 8D, an insulating layer (insulating film) 8 is selectively formed on the leads-forming-side surface of the base 1b and solder balls 11 are formed in openings 9 of the insulating layer 8.

Figure 8E:
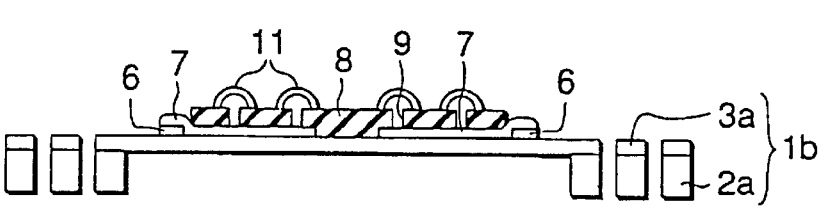

Then, as shown in FIG. 8E, that portion of the thick copper layer 2a on the back side of the base 1b which is located inside the portion (32) to become the outer ring is removed by selective etching from the back side. At this time, the etching stop layer 3a made of nickel serves as an etching stopper for preventing etching of the circuit wiring 7 including the inner leads. At this stage, the etching stop layer 3a made of nickel remains except the portions that were removed by the selective etching shown in FIG. 8C.

Figure 8F:
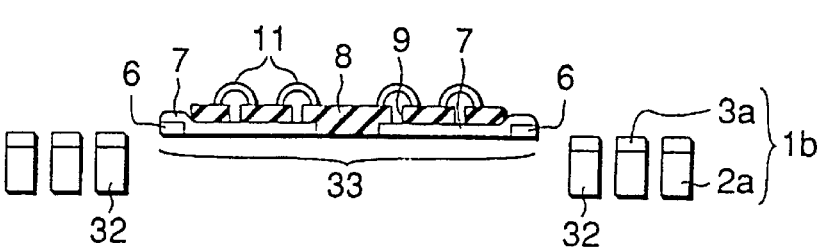

Then, as shown in FIG. 8F, the etching stop layer 3a made of nickel is etched by using the inner leads 7 and the suspensions 31 (none of the suspensions 31 are present in FIG. 8F; see FIG. 10) as masks. As a result, respective wiring lines 7 including the inner leads are made independent of each other; that is, their electrically short-circuited state ends at this time. In FIG. 8F, a main portion 33 of the lead frame looks as if to be separated from the outer ring 32. This is because none of the suspensions 31 appear in the cross-section of FIG. 8F. Actually, the main portion 33 is integrated with the outer ring 32 via the suspensions 31.

FIGS. 9A–9D are sectional views showing, in order of steps, a process of attaching a lead frame that has been manufactured by the above method to a semiconductor chip.

First, as shown in FIG. 9A, a semiconductor chip 12 that has been aligned and positioned is bonded to the lead frame via a buffer adhesive layer 34. The buffer adhesive layer 34 has not only a role of bonding the lead frame and the semiconductor chip 12 together but also a role of protecting the surface of the semiconductor chip 12. Therefore, the buffer adhesive layer 34 is required to act as a cushion.

Then, as shown in FIG. 9B, the bumps 6 at the tip portions of the respective inner leads 7 are connected to the corresponding electrode pads 5 of the semiconductor chip 12 by single point bonding, for instance. Reference numeral 36 denotes a bonding tool for single point bonding. According to the current technology, it is difficult to perform gang bonding on a chip-size-package-type lead frame because a semiconductor chip has electrodes in its peripheral portion. However, as the technology advances, gang bonding may become possible in the future.

Then, as shown in FIG. 9C, a sealing agent 37 such as a epoxy resin or a silicone resin is injected, by potting, into the spaces between the semiconductor chip 12/lead frame main portion 33 and the outer ring 32 to effect sealing and to fix the semiconductor chip 12/lead frame main portion 33 and the outer ring 32 to each other.

Then, as shown in FIG. 9D, the lead frames corresponding to the respective semiconductor chips 12 are separated from each other by cutting away the unnecessary portions of the lead frames that connect, in an integral manner, the inner leads for the plurality of semiconductor chips 12. As a result, a semiconductor device is obtained which has the lead frame as an intermediate circuit substrate, which has, on the intermediate circuit substrate, the solder balls 11 as ball-grid-array-like external terminals that are connected to the respective electrodes of the semiconductor chip 12, and which is reinforced by the outer ring 32. FIG. 10 is a plan view of the semiconductor device in which the sealing agent 37 is omitted.

This embodiment provides the same advantages as the first to third embodiments except the advantage that the productivity can be increased by performing bonding en bloc by gang bonding.

Although in the above embodiments the etching stop layers 3 and 3a are formed by using nickel, they may be formed by using aluminum.

Figure 11:
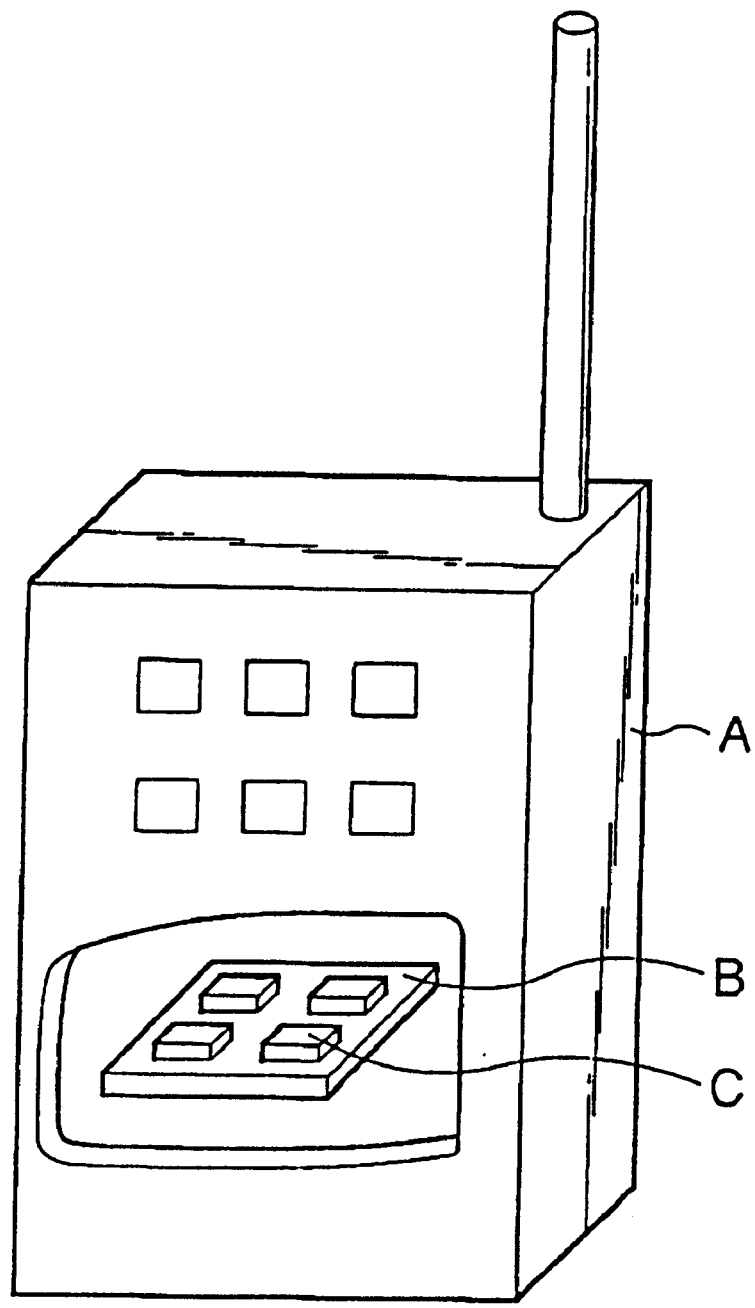
FIG. 11 is a partially cutaway perspective view of an electronic apparatus using a semiconductor device that uses a lead frame according to the invention.

Since the above-described several kinds of lead frames contribute to miniaturization of semiconductor devices, semiconductor devices using those lead frames contribute to miniaturization of electronic apparatuses when used therein. FIG. 11 is a partially cutaway perspective view showing an example of such electronic apparatuses (cellular telephone). In FIG. 11, reference character A denotes an electronic apparatus, for instance, a cellular telephone, and character B denotes a mother board in the electronic apparatus A. A semiconductor device C according to the invention that is mounted on the mother board B constitutes an internal circuit of the electronic apparatus A.

A first manufacturing method of a lead frame according to the invention comprises the steps of forming metal films to constitute bumps by plating on a base made of a metal; and forming, by plating with a metal, a circuit wiring including inner leads so that the inner leads are connected to the respective metal films.

This manufacturing method of a lead frame can increase the adhesion to the underlying member because of the use of plating rather than evaporation, and can shorten the time required for forming metal films of a necessary thickness because of their high growth rate. Further, the investment in equipment can be reduced because the cost of equipment for plating is lower than that for evaporation.

Since metal films to constitute bumps are formed by plating on a highly rigid base that has not been formed with inner leads yet, the underlying member (base member) is more stable than in a case of forming metal films on the tip portions of the surfaces of inner leads already formed. Therefore, the bumps are easy to form and the accuracy of their forming positions can be increased.

The metal films may be formed by forming, on the base, a resist film having a negative pattern of a pattern of the intended circuit wiring, and performing the plating in a state that tip portions of the respective inner leads are masked by a mask jig so as to be prevented from being plated. In this case, by securing a proper positional relationship between the resist film and the mask jig, the metal films to constitute bumps can easily be formed with a relatively correct positional relationship with inner leads to be formed next so as to be connected to the metal films.

Further, the circuit wiring including the inner leads may be formed thereafter by performing plating by using only the resist film as a mask in a state that the mask jig is removed. In this case, a desired positional relationship between the bumps and the circuit wiring can be established with high accuracy.

A second manufacturing method of a lead frame according to the invention comprises the steps of forming metal films to constitute bumps by plating on a base having, on a surface thereof, an etching stop layer; forming, by plating with a metal, a circuit wiring including inner leads so that the inner leads are connected to the respective metal films; forming, so as to cover the circuit wiring, an insulating film having openings where the circuit wiring is exposed; forming external electrodes in the respective openings by plating; selectively etching a portion, opposite to the circuit wiring, of the base by using the etching stop layer as a stopper for preventing etching of a portion, on a side of the circuit wiring, of the base; and removing the etching stop layer.

In this manufacturing method of a lead frame, metal films to constitute bumps are formed on a base having an etching stop layer on its surface and a circuit wiring is thereafter formed. This makes it possible to apply the technique of the above-described first manufacturing method of a lead frame for forming metal films as bumps to techniques in which inner leads are formed by using, as a base, a structure in which an etching stop layer is formed on the surface of a relatively thick metal layer made of copper or the like that will become the frame portion of a lead frame, that is, an outer ring, or by using a structure in which a material layer for forming a circuit wiring including inner leads is further formed on the surface of the etching stop layer (refer to Japanese Unexamined Patent Publication Nos. Hei. 8-148530 and Hei. 8-47221).

The metal films to constitute bumps may be formed by using gold. In this case, the metal films can be bonded to a semiconductor chip with good bonding performance. Not only single point bonding but also gang bonding can be enabled.

The metal films to constitute bumps may be formed by using palladium. In this case, the metal films can be bonded to the respective electrodes of a semiconductor chip with good bonding performance. Not only single point bonding but also gang bonding can be enabled. Since palladium is less expensive than gold, this manufacturing method contributes to lowering the price of a lead frame, that is, the price of a semiconductor device using such a lead frame. Further, the palladium plating is easy to manage and the management cost is low, because it is not necessary to use a dangerous plating liquid unlike gold plating or the like.

The thickness of the palladium films to constitute bumps may be set at 0.01 μm or more. In this case, the bumps are given bonding performance and elasticity that are sufficient for bonding with electrode pads.

Nickel films to serve as undercoats may further be formed on the respective palladium films to constitute bumps. In this case, the nickel films play a role of preventing diffusion of ultrasonic waves in bonding the bumps to the respective electrodes of a semiconductor chip, thereby preventing a problem that ultrasonic vibration would otherwise be diffused and not be concentrated on the bonding portions to make the bonding incomplete. This provides good bonding results.

According to the lead frame of the invention, since the metal films to constitute bumps are formed by using palladium, the metal films can be bonded to the respective electrodes of a semiconductor chip with good bonding performance. Not only single point bonding but also gang bonding can be enabled. Since palladium is less expensive than gold, this manufacturing method contributes to lowering the price of a lead frame, that is, the price of a semiconductor device using such a lead frame. Further, the palladium plating is easy to manage and the management cost is low, because it is not necessary to use a dangerous plating liquid unlike gold plating or the like.

The thickness of the palladium films to constitute bumps may be set at 0.01 μm or more. In this case, the bumps are given bonding performance and elasticity that are sufficient for bonding with electrode pads. This provides better bonding results.

The respective palladium films constituting the bumps may have nickel films serving as undercoats. In this case, the nickel films play a role of preventing diffusion of ultrasonic waves in bonding the bumps to the respective electrodes of a semiconductor chip, thereby preventing a problem that ultrasonic vibration would otherwise be diffused and not be concentrated on the bonding portions to make the bonding incomplete. This provides good bonding results.

According to the semiconductor device of the invention, since the bumps of the lead frame used are made of palladium rather than gold, the material cost is low and gang bonding is still possible. In the case of plating with gold, it is necessary to use a plating liquid containing cyan which is very toxic and dangerous. In the case of plating with aluminum, it is necessary to use an explosive plating liquid. In contrast, in the plating with palladium, it is not necessary to use such problematic plating liquids and hence a merit is obtained that the plating is very safe.

The thickness of the bumps of the lead frame used may be set at 0.01 μm or more. In this case, the bumps are given bonding performance and elasticity that are sufficient for bonding with electrode pads. This provides better bonding results.

The respective bumps may have nickel films serving as undercoats. In this case, the nickel films play a role of preventing diffusion of ultrasonic waves in bonding the bumps to the respective electrodes of a semiconductor chip, thereby preventing a problem that ultrasonic vibration would otherwise be diffused and not be concentrated on the bonding portions to make the bonding incomplete. This provides good bonding results.

According to the assembling method of a semiconductor device of the invention, since the lead frame manufactured by any of the above manufacturing methods of a lead frame, a lead frame formed with bumps that has good bonding performance and enables gang bonding can be used in assembling a semiconductor device. Where the inner leads of such a lead frame are bonded to the respective electrode pads of a semiconductor device by single point bonding, bonding can be performed with much superior performance. Where gang bonding is performed, the productivity can be increased.

According to the electronic apparatus of the invention, by virtue of the use of the semiconductor device that is given the above-mentioned advantages of the lead frame, this electronic apparatus benefits from the same advantages.

What is claimed is:

1. A manufacturing method of a lead frame, comprising the steps of:

forming metal films to constitute bumps by plating at positions on a base made of a metal that allow the bumps to be bonded to at least respective electrodes of a semiconductor chip; and subsequently, forming, by plating with a metal, a circuit wiring including inner leads so that the inner leads are connected to the respective metal films.

2. The manufacturing method according to claim 1, wherein the metal films are formed by forming, on the base, a resist film having a negative pattern of a pattern of the intended circuit wiring, and performing the plating in a state that tip portions of the respective inner leads are masked by a mask jig so as to be prevented from being plated, and wherein the circuit wiring is formed by removing the mask jig and performing plating by using only the resist film as a mask.

3. An assembling method of a semiconductor device, comprising the steps of:

manufacturing a lead frame by the manufacturing method according to claim 1; and bonding, at the bumps, the inner leads of the lead frame to respective electrode pads of a semiconductor chip by single point bonding or gang bonding.

4. A manufacturing method of a lead frame, comprising the steps of:

forming metal films to constitute bumps by plating at positions on a base made of a metal that allow the bumps to be bonded to at least respective electrodes of a semiconductor chip, the base having, on a surface thereof, an etching stop metal layer to serve as an etching stopper;

subsequently, forming, by plating with a metal, a circuit wiring including inner leads so that the inner leads are connected to the respective metal films;

forming, so as to cover the circuit wiring, an insulating film having openings where the circuit wiring is exposed;

forming electrodes as external terminals in the respective openings by plating;

selectively etching a portion, opposite to the circuit wiring, of the base by using the etching stop metal layer as a stopper for preventing etching of a portion, on a side of the circuit wiring, of the base; and removing the etching stop metal layer.

5. The manufacturing method according to claim 1, wherein the metal films are formed by using gold.

6. The manufacturing method according to claim 1, wherein the metal films are formed by using palladium.

7. The manufacturing method according to claim 6, wherein the metal films are formed at a thickness of 0.01 $\mu$m or more.

8. The manufacturing method according to claim 6, further comprising the step of forming nickel films to serve as undercoats on the respective metal films.

9. An assembling method of a semiconductor device, comprising the steps of:

manufacturing a lead frame by the manufacturing method according to claim 4; and bonding, at the bumps, the inner leads of the lead frame to respective electrode pads of a semiconductor chip by single point bonding or gang bonding.

* * * * *